(12) United States Patent
Hamada et al.

(10) Patent No.: US 7,239,018 B2
(45) Date of Patent: Jul. 3, 2007

(54) COMPOSITION FOR FORMING A POROUS FILM PREPARED BY HYDROLYSIS AND CONDENSATION OF AN ALKOXYSILANE USING A TRIALKYLMETHYLAMMONIUM HYDROXIDE CATALYST

(75) Inventors: Yoshitaka Hamada, Niigata-ken (JP); Fujio Yagihashi, Niigata-ken (JP); Hideo Nakagawa, Oumihachiman (JP); Masaru Sasago, Hirakata (JP)

(73) Assignees: Shin-Etsu Chemical Co., Ltd., Chiyoda-Ku, Tokyo (JP); Matsushita Electric Industrial Co., Ltd., Osaka (JP)

( * ) Notice: Subject to any disclaimer, the term of this patent is extended or adjusted under 35 U.S.C. 154(b) by 51 days.

(21) Appl. No.: 10/796,656

(22) Filed: Mar. 9, 2004

(65) Prior Publication Data

US 2004/0180554 A1    Sep. 16, 2004

(30) Foreign Application Priority Data

Mar. 10, 2003  (JP) .............................. 2003-062606

(51) Int. Cl.
*H01L 23/52*   (2006.01)
*H01L 21/473*  (2006.01)

(52) U.S. Cl. ................ 257/758; 438/790; 257/E21.273
(58) Field of Classification Search ................ 438/790
See application file for complete search history.

(56) References Cited

U.S. PATENT DOCUMENTS

| | | | |
|---|---|---|---|
| 4,634,509 A | 1/1987 | Shimizu et al. | |
| 5,494,859 A | 2/1996 | Kapoor | |
| 5,693,422 A * | 12/1997 | Basil et al. ................ | 428/412 |
| 5,707,783 A | 1/1998 | Stauffer et al. | |
| 6,022,812 A * | 2/2000 | Smith et al. ................ | 438/761 |
| 6,037,275 A | 3/2000 | Wu et al. | |
| 6,197,913 B1 | 3/2001 | Zhong | |
| 6,313,045 B1 | 11/2001 | Zhong et al. | |
| 6,359,096 B1 | 3/2002 | Zhong et al. | |
| 6,376,634 B1 | 4/2002 | Nishikawa et al. | |
| 6,391,999 B1 | 5/2002 | Crivello | |
| 6,410,150 B1 * | 6/2002 | Kurosawa et al. .......... | 428/447 |
| 6,413,647 B1 | 7/2002 | Hayashi et al. | |
| 6,495,479 B1 * | 12/2002 | Wu et al. ................... | 438/781 |
| 6,512,071 B1 | 1/2003 | Hacker et al. | |
| 6,533,855 B1 | 3/2003 | Gaynor et al. | |
| 6,534,025 B1 | 3/2003 | Yano et al. | |
| 6,596,404 B1 | 7/2003 | Albaugh et al. | |
| 6,632,489 B1 | 10/2003 | Watanabe et al. | |
| 6,639,015 B1 | 10/2003 | Nakashima et al. | |
| 6,696,538 B2 | 2/2004 | Ko et al. | |
| 2002/0020327 A1 | 2/2002 | Hayashi et al. | |
| 2002/0098279 A1 | 7/2002 | Lyu et al. | |
| 2002/0155053 A1 | 10/2002 | Nishiyama et al. | |
| 2003/0064321 A1 | 4/2003 | Malik et al. | |
| 2003/0091838 A1 | 5/2003 | Hayashi et al. | |
| 2003/0104225 A1 | 6/2003 | Shiota et al. | |

FOREIGN PATENT DOCUMENTS

| | | |
|---|---|---|
| EP | 1223192 A1 | 7/2002 |
| EP | 1245642 A1 | 10/2002 |
| JP | 63-15355 | 4/1988 |
| JP | 05-125191 | 5/1993 |
| JP | 06-145599 | 5/1994 |
| JP | 09-194298 | 7/1997 |
| JP | 2000-044875 | 2/2000 |
| JP | 2000-309751 | 11/2000 |
| JP | 2000-309753 | 11/2000 |
| JP | 2000-345041 | 12/2000 |
| JP | 2001-002993 | 1/2001 |
| JP | 2001-049178 | 2/2001 |
| JP | 2001-049179 | 2/2001 |
| JP | 2001-055554 | 2/2001 |
| JP | 2001-080915 | 3/2001 |
| JP | 2001-98218 | 4/2001 |
| JP | 2001-115021 | 4/2001 |
| JP | 2001-115028 | 4/2001 |
| JP | 2001-115029 | 4/2001 |
| JP | 2001-130911 | 5/2001 |
| JP | 2001-131479 | 5/2001 |
| JP | 2001-157815 | 6/2001 |
| JP | 2001-164186 | 6/2001 |

| JP | 2001-203197 | 7/2001 |
| JP | 2001-240798 | 9/2001 |
| JP | 2001-354904 | 12/2001 |
| JP | 2002-020688 | 1/2002 |
| JP | 2002-020689 A | 1/2002 |
| JP | 2002-023354 | 1/2002 |
| JP | 2002-030249 A | 1/2002 |
| JP | 2002-038090 A | 2/2002 |
| WO | WO 00/12640 | 3/2000 |
| WO | WO 03/088344 | 10/2003 |

OTHER PUBLICATIONS

Burkett et al., "Synthesis Of Hybrid Inorganic-Organic Mesoporous Silica By Co-Condensation Of Siloxane And Organosiloxane Precursors," *J. Chem. Soc. Chem. Commun.*, 1996, 1367-1368.

Inagaki et al., "Synthesis Of Highly Ordered Mesoporous Materials From A Layered Polysilicate", *J. Chem. Soc. Chem. Commun.*, 1993, pp. 680-682.

\* cited by examiner

*Primary Examiner*—Stephen W. Smoot
(74) *Attorney, Agent, or Firm*—Alston & Bird LLP

(57) ABSTRACT

Provided is a composition formed by hydrolysis and condensation composition of the alkoxysilane, the composition comprising a reduced amount of metallic and halogen impurities and being applicable as electronic material. Also provided is an insulating film having low dielectric constant produced by applying the composition and sintering it. More specifically, a method for manufacturing a composition for forming a film, comprising a step of hydrolysis and condensation of alkoxysilane or a partial hydrolysis product of the alkoxysilane in an organic solvent in the presence of trialkylmethylammonium hydroxide as catalyst, wherein the alkoxysilane is selected from the groups consisting of compounds represented by formulae (1) to (4) below, and the trialkylmethylammonium hydroxide is represented by formula (5) below. Provided are a composition for forming a film obtained by the method, and a low dielectric constant film having low metallic and halogen impurities, the film produced by applying the composition for forming a film on a substrate and sintering it.

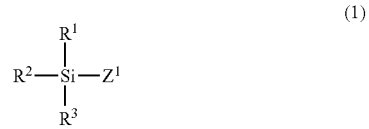

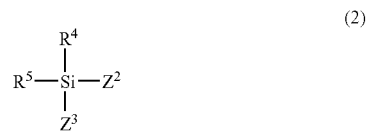

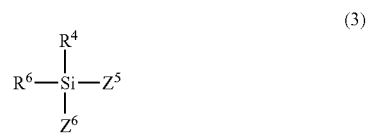

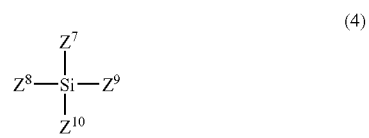

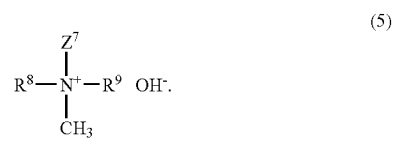

11 Claims, 1 Drawing Sheet

COMPOSITION FOR FORMING A POROUS FILM PREPARED BY HYDROLYSIS AND CONDENSATION OF AN ALKOXYSILANE USING A TRIALKYLMETHYLAMMONIUM HYDROXIDE CATALYST

BACKGROUND OF THE INVENTION

1. Field of the Invention

The present invention relates to a composition for film formation and a method for forming the same, which can be formed into a porous film that has low permittivity (dielectric constant) and reduced impurity and excels in mechanical strength; a porous film and a method for forming the same; and a semiconductor device which contains the porous film inside.

2. Description of the Related Art

In the fabrication of semiconductor integrated circuits, as the circuits are packed tighter, an increase in interconnection capacitance, which is a parasitic capacitance between metal interconnections, leads to an increase in interconnection delay time, thereby hindering the enhancement of the performance of semiconductor circuits. The interconnection delay time is called an RC delay which is in proportion to the product of the electric resistance of the metal interconnections and the static capacitance between the interconnections. Reducing the interconnection delay time requires reducing the resistance of metal interconnections or the interconnection capacitance.

The reduction in resistance of the interconnection metal and the interconnection capacitance can prevent a densely packed semiconductor device from causing an interconnection delay, thereby realizing a downsized and faster semiconductor device with reduced power consumption.

In an attempt to reduce the resistance of metal interconnections, in recent years, metallic copper interconnections have been employed more than conventional aluminum interconnections in the structure of a multilayered interconnection. However, use of this structure alone has limits in the enhancement of the performance, so the reduction in interconnection capacitance is an urgent necessity for higher performance of semiconductors.

One method for reducing interconnection capacitance is to reduce the relative permittivity (dielectric constant) of an interlevel insulator film disposed between metal interconnections. As such an insulator film with a low relative permittivity, it has been considered to use a porous film instead of a silicon oxide film which has been used conventionally. A porous film can be said to be the only practical film as a material with a relative permittivity of 2.0 or less, and various methods for forming a porous film have been proposed. The material that forms this porous film includes a composition for forming a porous film which is manufactured by hydrolysis and condensation of alkoxysilane.

Conventionally, a product of hydrolysis and condensation of alkoxysilane is used as an insulating material for the electronic material because of high thermal and chemical stabilities thereof. It is manufactured by reaction between alkoxysilane and water in the organic solvent in the presence of acid or alkali catalyst. The alkoxysilane has been purified and the metallic impurity is prevented from entering so that a highly pure insulating product is obtained, which is suitable for electronic material. However, recently, a high performance insulating material, especially, the material having a low dielectric constant is demanded. It is because the insulating material having a low dielectric constant does not easily cause the delay of fine interconnection wiring.

Although the insulating material having a low dielectric constant can be effectively obtained by introducing pores into the insulator film, the introduction of pores reduces the mechanical strength. Thus, there is demand for the insulating material which can satisfy a low dielectric constant and a high mechanical strength at the same.

On the other hand, it is known that use of a strong base in the hydrolysis and condensation reaction of alkoxysilanes yields a hard silica solid. It is reported that the insulating material having a low dielectric constant was produced by the hydrolysis and condensation in the presence of a strong base. However, the tetraalkylammonium hydroxide which is conventionally and commonly available as a strong basic catalyst is manufactured by removing a halogen from the reaction product between tertiary amine and alkyl halide. Accordingly, a byproduct of alkali halide remains in the tetraalkylammonium hydroxide so that the tetraalkylammonium hydroxide contains a significant amount of metallic and halogen impurities. When the tetraalkylammonium hydroxide is used without purification, the metallic and halogen impurities are mixed into the composition obtained by hydrolysis and condensation of the alkoxysilane. Then, additional numerous steps are required to remove the impurities.

As mentioned above, conventional materials have the problem that a low dielectric constant and strong mechanical strength are not attained at the same time. Moreover, the composition for forming a porous film produced in the conventional method has a problem that large amounts of metallic and halogen impurities are contained therein. Further, when a conventional porous film is incorporated into the multilayer interconnection of the semiconductor device as an insulator film, there is a problem that sufficient low dielectric constant cannot be obtained as the film having mechanical strength necessary for manufacturing the semiconductor device is used, and sufficient mechanical strength cannot be obtained as the film having the low dielectric constant is used.

Thus, when the dielectric constant of the porous film used as an insulating film in the multilayer interconnection of the semiconductor device is too high, the RC delay in the multilayer interconnection of the semiconductor device is increased and the performance of the semiconductor device (high speed and low power consumption) is not improved. These represent large problems. Moreover, a porous film having a low mechanical strength deteriorates the reliability of the semiconductor device.

SUMMARY OF THE INVENTION

An object of the invention is to provide a composition produced by hydrolysis and condensation, comprising reduced amounts of metallic and halogen impurities, the composition which can be used as electronic material, and to provide a porous insulating film having a low dielectric constant obtained by coating and sintering the composition. Another object of the invention is to provide a high-performing and highly reliable semiconductor device which contains the porous film inside.

After an effort to achieve the objects, the inventors have found that tetralkylammonium hydroxide obtained by the electrolysis of quaternary ammonium carbonate produced by the reaction between trialkylamine and dialkyl carbonate, comprises reduced amounts of alogen and metallic impurities wherein boron is counted in the metallic impurity, and is an excellent basic catalyst in the hydrolysis and condensation reaction of alkoxysilane to produce a silica composition imparting high hardness. Then, they have completed the invention.

According to the invention, provided is a method for manufacturing a composition for forming a porous film, comprising a step of hydrolysis and condensation of alkoxysilane or a partial hydrolysis product of the alkoxysilane in an organic solvent in the presence of trialkylmethylammonium hydroxide as catalyst, wherein the alkoxysilane is one or more selected from the group consisting of compounds represented by formulae (1) to (4) below, and the trialkylmethylammonium hydroxide is represented by formula (5) below,

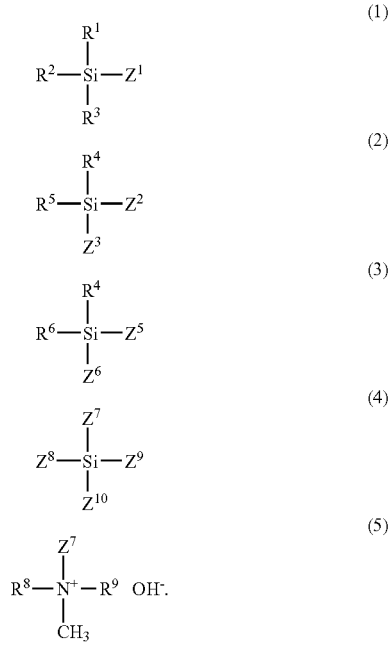

wherein $Z^1$, $Z^2$, $Z^3$, $Z^4$, $Z^5$, $Z^6$, $Z^7$, $Z^8$, $Z^9$ and $Z^{10}$ each independently represents an alkoxy group having 1 to 6 carbons; $R^1$, $R^2$, $R^3$, $R^4$, $R^5$ and $R^6$ each independently represents a monovalent hydrocarbon group which may or may not be substituted; and $R^7$, $R^8$ and $R^9$ each independently represents an alkyl group having 1 to 6 carbons.

Moreover, according to the invention, provided are a composition for forming a film manufactured by said method, and a low dielectric film formed by applying said composition on a substrate so as to form a film and sintering the film. The low dielectric film contains a reduced content of metallic and halogen impurities.

According to the invention, the composition produced by hydrolysis and condensation of alkoxysilane, the composition comprising metallic and halogen impurities in a content reduced sufficiently enough to be required for the application of electronic materials, can be provided without a special purification step thereof. Moreover, a low dielectric constant insulating film having appropriate mechanical strength can be provided.

The semiconductor device of the invention comprises a porous film therein, the porous film being formed by a composition comprising 10 ppm or less halogen impurity and 100 ppb or less metallic impurity where boron is counted in the metallic impurity, the composition being prepared by hydrolysis and condensation of alkoxysilane or a partial hydrolysis product of the alkoxysilane in an organic solvent in the presence of trialkylmethylammonium hydroxide as catalyst, wherein the alkoxysilane is one or more selected from the groups consisting of compounds represented by formulae (1) to (4) above, and the trialkylmethylammonium hydroxide is represented by formula (5) above. Specifically, said porous film may be used as an insulating film for the multilayer interconnection in the semiconductor device.

Thus, keeping the mechanical strength of the semiconductor device secured, the hygroscopic property of the porous film is decreased. Hence, the semiconductor device with a built-in insulator film having a low dielectric constant is obtained. Because of lowering dielectric constant of the insulator film, the parasitic capacitance of the area around the multilayer interconnection is decreased, leading to the high-speed operation and low power consumption of the semiconductor device.

Moreover, it is preferable for the semiconductor device of the invention that said porous film is between metal interconnections in a same layer of multi-level interconnects, or is between upper and lower metal interconnection layers. This arrangement can achieve a high-performing and highly reliable semiconductor device.

According to the invention, the composition for the insulation film formation which comprises extremely low content of halogen and metallic impurities can be obtained. In addition, the insulation film having low dielectric constant and high mechanical strength can be obtained by applying the composition so as to form a film and sintering the film. In addition, use of the porous formed by the composition of the invention as the insulator film of the multilayered interconnections can produce a high-performing and highly reliable semiconductor device.

DETAILED DESCRIPTION OF THE PREFERRED EMBODIMENTS

Figure 1:
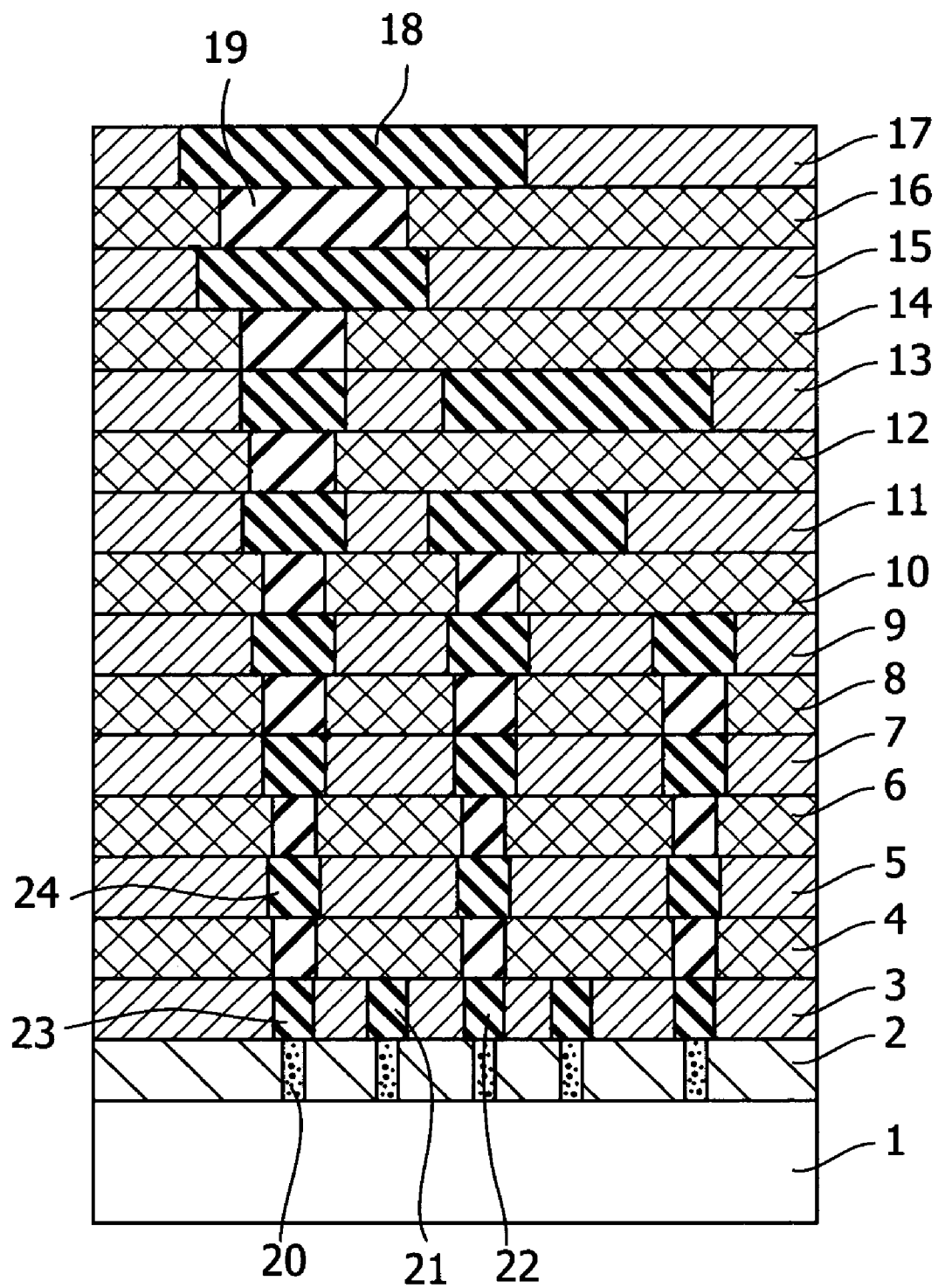
FIG. 1 is a schematic cross-sectional view of a semiconductor device of the present invention.

The invention will be explained in detail below.

The purification method of the invention relates to the purification method of the coating liquid of the insulating material which is used as an application of electronic materials, particularly to the purification method of the compositions which are used as the insulating film having a low dielectric constant between porous layers.

Special resin, solvent, catalysts and additives are used for manufacturing a porous silica interlevel (or interlayer) insulating film so as to provide a stable formation of micropores. The solvent to be used has been considerably limited so as to obtain solubility and desirable physical properties of the sintered film. For example, a solution mixed with water at an arbitrary ratio may be used. Consequently, the removal of metallic and ionic impurities in the solution is difficult. Although it is reported that propylene glycol monopropyl ether is a solvent excelling especially in a low dielectric constant and storage stability (Japanese Patent Provisional Publication No. 2000-345041). However, since this solvent is mixed with water at an arbitrary ratio, purification through common washing in water is difficult.

Accordingly, it becomes necessary to minimize the impurities derived from raw materials and others. However, removing impurities from tetraalkylammonium hydroxide is more difficult than from the alkoxysilanes used as a solvent or raw material because usual distillation purification of the tetraalkylammonium hydroxide cannot be used.

Regarding the method for producing the tetraalkylammonium hydroxide having a reduced content of impurities, there is the method comprising the electrolysis of the product obtained from the reaction between trialkylamine and dialkyl carbonate, using the cation exchange membrane as a diaphragm (Japanese Patent Publication (JP-B) No. 63-15355). In this method, the trialkylamine is reacted with the dimethyl carbonate to produce trialkylmethylammonium carbonate, which is subsequently electrolyzed in an electrolysis tank having the cation exchange membrane as a diaphragm to produce the tetraalkylammonium hydroxide. Consequently, the highly pure trialkylammonium containing a methyl group can be obtained.

According to the invention, the tetraalkylammonium hydroxide, having a reduced content of halogen and metallic impurities, produced in the above manufacturing method is used as a catalyst for the hydrolysis and condensation of the alkoxysilane mixture. Consequently, A highly pure composition can be produced by the hydrolysis and condensation of alkoxysilane without a troublesome step such as washing with water. In addition, when the composition is used as a main component in a composition for forming a insulating film, an insulating film having a low dielectric constant and sufficient mechanical strength is produced by applying the composition on a substrate and sintering it.

The trialkylmethylammonium to be used in the invention is represented by formulation (5), wherein $R^7$ to $R^9$ each independently represents a monovalent hydrocarbon group where the hydrocarbon group may or may not be substituted. The total carbon number of $R^7$ to $R^9$ may be preferably 4 to 15.

The trialkylmethylammonium hydroxide catalyst used in the invention may include tetramethylammonium hydroxide, ethyltrimethylammonium hydroxide, propyltrimethylammonium hydroxide, butyltrimethylammonium hydroxide, pentyltrimethylammonium hydroxide, hexyltrimethylammonium hydroxide, diethyldimethylammonium hydroxide, dipropyldimethylammonium hydroxide, dibutyldimethylammonium hydroxide, triethylmethylammonium hydroxide, tripropylmethylammonium hydroxide and tributylmethylammonium hydroxide.

The alkoxysilane used in the invention may be selected from the group consisting of monofunctional silane represented by formula (1), bifunctional silane represented by formula (2), trifunctional silane represented by formula (3), and tetrafunctional silane represented by formula (4).

The $Z^1$ to $Z^{10}$ in formulas (1) to (4) each may independently represent an alkoxy group having 1 to 6 carbons, preferably including methoxy, ethoxy, n-propoxy and i-propoxy.

The $R^1$ to $R^6$ in formulas (1) to (4) each may independently represents a substituted or non-substituted monovalent hydrocarbon group, preferably including methyl, ethyl, n-propyl, i-propyl, n-butyl group and phenyl.

The alkoxysilane used in this invention may include tetrafunctional silane such as tetramethoxysilane, tetraethoxysilane, tetrapropoxysilane and tetrabutoxysilane; trifunctional silane such as methyltrimethoxysilane, methyltriethoxysilane, methyltripropoxysilane, methyltributoxysilane, ethyltrimethoxysilane, ethyltriethoxysilane, ethyltripropoxysilane, ethyltributoxysilane, propyltrimethoxysilane, propyltriethoxysilane, propyltripropoxysilane, propyltributoxysilane, vinyltrimethoxysilane, vinyltriethoxysilane, vinyltripropoxysilane, vinyltributoxysilane, phenyltrimethoxysilane, phenyltriethoxysilane, phenyltripropoxysilane and phenyltributoxysilane; bifunctional silane such as dimethyldimethoxysilane, dimethyldiethoxysilane, diethyldimethoxysilane and diethyldiethoxysilane; monofunctional silane such as trimethylmethoxysilane trimethylethoxysilane; and a mixture thereof, and a partially hydrolyzed product thereof.

The hydrolysis and condensation reaction may be carried out by adding alkoxysilane or a mixture of partial hydrolyzed alkoxysilane to a mixture of organic solvent, water and tetraalkylammonium hydroxide as hydrolysis catalyst.

The organic solvent used in this invention may include alcohol such as methanol, ethanol, n-propanol, i-propanol, n-butanol, 2-butanol and isobutanol; ether such as tetrahydrofuran, dioxane, ethylene glycol methyl ether, ethylene glycol ethyl ether, ethylene glycol propyl ether, ethylene glycol butyl ether, propylene glycol methyl ether, propylene glycol ethyl ether, propylene glycol propyl ether and propylene glycol butyl ether.

The mixing ratio of the organic solvent and water may be preferably the organic solvent/water of 90/10 to 10/90. The alkoxysilane or the mixture of the partially hydrolyzed alkoxysilane may be added in an amount of 0.01 to 20% by weight based on the weight of all solvents (the organic solvent and water). It should be noted that said amount of 0.01 to 20% by weight is the amount of the product obtained by complete condensation. The trialkylmethylammonium hydroxide may be added in an amount of 0.1 to 10,000 mole % based on moles of silane in alkoxysilane or partially hydrolyzed alkoxysilane The reaction temperature of the hydrolysis and condensation may be 0 to 100° C., preferably 30 to 80° C., more preferably 50 to 80° C. Although the alkoxysilane may be added all at once, it may be preferably added dropwise over 0 to 10 hours. It may be preferable that thermal aging is carried out after the dropwise addition, wherein the aging may be at 50 to 80° C. for 0 to 10 hours.

The product obtained by the hydrolysis and condensation of alkoxysilane or partially hydrolyzed alkoxysilane may be weight-average molecular weight of 10,000 to 1,000,000 based on polyethylene with Gel Permeation Chromatography (GPC). It is because the product having the weight-average molecular weight in this range can be soluble in the organic solvent so that spin coating is applicable.

A product obtained by hydrolysis and condensation of the alkoxysilane may be used as the composition for forming a insulator film. A solvent having a high boiling point may be added to the product or solvent exchange of the product may be done so as to produce the composition for forming a insulator film. An additive or catalyst may be added to product in some cases so as to produce the composition for forming a insulator film. Of course, the purification step such as washing with water can be added to obtain even more highly pure composition for forming an insulating film.

According to the invention, the halogen impurity contained in the composition for forming the insulating film is 10 ppm or less and the metallic impurity which is the total amount of impurity for all is 100 ppb or less.

The content of the halogen impurity is the total amount of impurity of all of fluorine, chlorine, bromine and iodine and is obtained based on chlorine (weight) by measurement with coulometric titration using the combustion method.

The metallic impurity may be the impurity of metals including Li, B, Na, Mg, Al, K, Ca, Cr, Mn, Fe, Ni, Cu, Zn, Sn and Pb and analyzed with ICP-MS.

The composition for forming an insulating film can be spin-coated on a silicon substrate, and sintered so as to produce an insulating film having a low dielectric constant. The sintered insulating film may have dielectric constant of 2.7 or less. The insulating film having dielectric constant of 2.2, or 2.0 or less can be obtained if an appropriate condition is selected. These films have high mechanical strength which is more than sufficient to be used in practice as the insulating material between fine interconnecting wiring. Further detail will be explained.

A film having a desirable thickness can be formed by spin-coating an appropriately controlled concentration of the coating liquid with an appropriate number of spin rotations. For example, the actual film thickness of the thin film may be about 0.2 to 1 μm, but not limited to this range. For example, by applying the coating solution several times, the thickness of the film can be increased. The solvent used for dilution may include the same solvents as said solvent used for the replacement so as to prepare a coating liquid. The solvent may be used singly or as a mixture of two or more solvents.

Although the degree of dilution may depend on the viscosity and intended film thickness, generally 50 to 99 wt %, preferably 75 to 95 wt % solvent may be contained in the diluted solution.

The film thus prepared may be heated preferably for several minutes at 50 to 150° C. in a drying step (generally called a pre-bake in the semiconductor process) so as to remove the solvent. The heating step for hardening the coating film follows the drying process. In the heating step, the coated film may be heated to preferably 150 to 500° C., more preferably 200 to 400° C. The heating time may be 1 to 300 minutes, more preferably 1 to 100 minutes.

The obtained film has high mechanical strength in the entire film. Measured with nanoindentation, hardness is commonly 1 to 10 GPa and modulus of elasticity is commonly 5 to 50 GPa. This indicates that the obtained film has much higher mechanical strength than the porous material produced by adding a thermally decomposable polymer to silicone resin and thermally removing the polymer so as to form pores. It is because the material has hardness of 0.05 to 2 GPa and modulus of elasticity of 1.0 to 4.0 GPa.

The porous film of the present invention is particularly preferable as the interlevel insulator film of the interconnections in a semiconductor integrated circuit. The semiconductor device is required to reduce interconnection capacitance in order to prevent interconnection delay when highly integrated. Various means have been developed to achieve this, and one of them is to reduce the relative permittivity of the interlevel insulator film disposed between metal interconnections. When an interlevel insulator film is prepared by using the composition for forming a porous film of the present invention, the semiconductor device can be downsized and faster and consume less power.

There is a conventional problem that when a porous film is prepared by introducing pores in the film so as to lower the dielectric constant, the mechanical strength of the film decreases as the density of the material composing the film decreases. The decrease in mechanical strength not only affects the strength of the semiconductor device itself but also causes exfoliation due to insufficient strength in a chemical mechanical polishing process which is generally used in the fabrication process. Particularly, when used as the interlevel insulator film of a semiconductor, the porous film of the present invention with high mechanical strength and low relative permittivity prevents such exfoliation, thereby making it possible to fabricate a high-speed, highly reliable, and downsized semiconductor device.

The embodiments of the semiconductor device of the present invention will be described below. FIG. 1 shows a schematic cross-sectional view of an example of the semiconductor device of the present invention.

In FIG. 1, the substrate 1 is an Si semiconductor substrate such as an Si substrate or an SOI (Si-on-insulator) substrate; however, it can be a compound semiconductor substrate such as SiGe or GaAs. The interlevel insulator films include the interlevel insulator film 2 of the contact layer; the interlevel insulator films 3, 5, 7, 9, 11, 13, 15, and 17 of the interconnection layers; and the interlevel insulator films 4, 6, 8, 10, 12, 14, and 16 of the via layers. The interconnection layers corresponding to the lowermost interlevel insulator film 3 through the uppermost insulator film 17 are abbreviated as M1, M2, M3, M4, M5, M6, M7, and M8, respectively. The via layers corresponding to the lowermost interlevel insulator film 4 through the uppermost insulator film 16 are abbreviated as V1, V2, V3, V4, V5, V6, and V7, respectively. Although some of the metal interconnections are referred to with the numbers 18 and 21 to 24, the other regions with the same pattern not labeled with numbers indicate metal interconnections. The via plug 19 is made from a metal. In the case of copper interconnection, copper is generally used. The regions having the same pattern as the via plug 19 represent via plugs although they are not labeled with numbers in the drawing. The contact plug 20 is connected to the gate of the transistor (not illustrated) formed on the top surface of the substrate 1 or to the substrate. Thus, the interconnection layers and the via layers are alternately stacked, and multilayer interconnections generally indicate M1 and regions higher than M1. In general, M1 to M3 are called local interconnections, M4 and M5 are called intermediate interconnections or semi-global interconnections, and M6 to M8 are called global interconnections.

In the semiconductor device of the present invention, the porous film of the present invention is used as one or more of the interlevel insulator films 3, 5, 7, 9, 11, 13, 15, and 17 of the interconnection layers or the insulator films 4, 6, 8, 10, 12, 14, and 16 of the via layers.

For example, when the porous film of the present invention is used for the interlevel insulator film 3 of the interconnection layer (M1), the interconnection capacitance between the metal interconnection 21 and the metal interconnection 22 can be greatly reduced. When the porous film of the present invention is used for the interlevel insulator film 4 of the via layer (V1), the interconnection capacitance between the metal interconnection 23 and the metal interconnection 24 can be greatly reduced. Using the porous film with a low relative permittivity of the present invention as an interconnection layer can greatly reduce the metal interconnection capacitance in the same layer. On the other hand, using the porous film with a low relative permittivity of the present invention as a via layer can greatly reduce the interlevel capacitance between the vertical metal interconnections.

Therefore, using the porous film of the present invention for all of the interconnection layers and the via layers can greatly reduce the parasitic capacitance of the interconnections. Hence, the use of the porous film of the present invention as insulator films of the interconnections prevents a conventional problem, that is, an increase in the dielectric constant resulting from the porous film absorbing humidity while multilayered interconnections are formed by stacking porous films. As a result, the semiconductor device can perform high-speed and low-power operations.

The porous film of the present invention enables a semiconductor device to have higher mechanical strength by its high mechanical strength, thereby greatly improving the yield of the fabrication and the reliability of the semiconductor device.

The present invention will be described specifically through the following examples, but is not limited to them.

EXAMPLE 1

The 21.5 g of an aqueous 20 wt % solution of tetramethylammonium hydroxide (made by Tama Chemical Company) was added to a mixture of 237 g of ultra-pure water and 471 g of ethanol and then uniformly stirred. The mixture of 44.9 g of methyltrimethoxysilane and 68.6 g of tetraethoxysilane was added dropwise thereto. The resulting mixture was reacted at 60° C. for two hours, then the pH thereof was adjusted to be 4.3 by adding an aqueous solution of maleic acid. Propylene glycol monopropyl ether was added thereto, and concentrated at a reduced pressure until the siloxane concentration became 10 wt %. The resulting solution was then filtered with a filter made of Teflon™ having pore diameter of 0.05 μm, and consequently, coating composition (1) was obtained. The weight-average molecular weight of the product obtained by the hydrolysis and condensation of the alkoxysilane was about 100,000 as the result of measurement by GPC.

EXAMPLE 2

Coating composition (2) was obtained in the same manner as Example 1 except that 6.3 g of triethylmethylammonium hydroxide was used in the place of the 21.5 g of an aqueous 20 wt % solution of tetramethylammonium hydroxide. The triethylmethylammonium hydroxide had been produced by the reaction between triethylamine and dimethyl carbonate. The weight-average molecular weight of the product obtained by the hydrolysis and condensation of the alkoxysilane was about 120,000 as the result of measurement by GPC.

COMPARATIVE EXAMPLE 1

Coating composition (3) was obtained in the same manner as Example 1 except that 16.5 g of an aqueous 26 wt % solution of tetramethylammonium hydroxide (made by Tokyo Kasei Company) was used in the place of 21.5 g of an aqueous 20 wt % solution of tetramethylammonium hydroxide. The weight-average molecular weight of the product obtained by the hydrolysis and condensation of the alkoxysilane was about 100,000 as the result of measurement by GPC.

The contents of halogen and metallic impurities in the coating compositions obtained above are shown in Table 1, where the halogen impurity is based on chlorine by coulometric titration using the combustion method, and the metallic impurities were analyzed with ICP-MS.

TABLE 1

| | coating composition | impurities (ppm) | | | | | | | | |
| --- | --- | --- | --- | --- | --- | --- | --- | --- | --- | --- |
| | | halogen | Na | K | Fe | Ni | Cr | Ca | Al | Cu | Zn |
| Ex. 1 | (1) | 33 | 11 | 18 | <5 | <5 | <5 | <5 | <5 | <5 | <5 |
| Ex. 2 | (2) | 28 | 14 | 9 | <5 | <5 | <5 | <5 | <5 | <5 | <5 |
| Comp. Ex. 1 | (3) | 21,300 | 630 | 56,000 | <5 | <5 | <5 | 81 | 15 | <5 | <5 |

The obtained coating compositions were spin-coated on a silicon substrate and sintered at 120° C. for 2 minutes, 230° C. for 3 minutes and 425° C. for 60 minutes. Dielectric constant and mechanical strength of the obtained insulating films are shown in Table 2, where the dielectric constant was measured using the Mercury Probe Method and the modulus and hardness were measured using the nanoindentation method.

TABLE 2

| | dielectic contant | modulus (GPa) | hardness |
| --- | --- | --- | --- |
| Example 1 | 2.2 | 4.5 | 0.6 |
| Example 2 | 2.0 | 3.2 | 0.4 |
| Comp. Ex. 1 | 2.2 | 4.6 | 0.6 |

The invention claimed is:

1. A composition for forming a porous film, the composition comprising a hydrolysis and condensation product of an alkoxysilane or a partial hydrolysis product of the alkoxysilane in an organic solvent in the presence of trialkylmethylammonium hydroxide as a catalyst, wherein the trialkylmethylammonium hydroxide comprises a reaction product of trialkylamine and dimethyl carbonate, and wherein the alkoxysilane comprises one or more alkoxysilanes selected from the groups consisting of compounds represented by formulae (1) to (4) below, and the trialkylmethylammonium hydroxide is represented by formula (5) below,

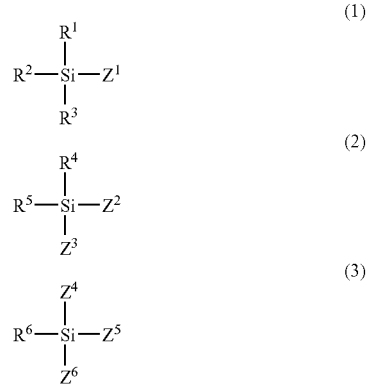

-continued (4)
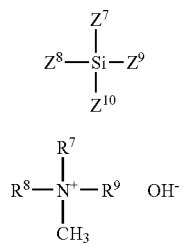

(5)

$$R^8\!-\!\underset{\underset{CH_3}{|}}{\overset{\overset{R^7}{|}}{N^+}}\!-\!R^9 \quad OH^-$$

wherein $Z^1$, $Z^2$, $Z^3$, $Z^4$, $Z^5$, $Z^6$, $Z^7$, $Z^8$, $Z^9$ and $Z^{10}$ each independently represents an alkoxy group having 1 to 6 carbons; $R^1$, $R^2$, $R^3$, $R^4$, $R^5$ and $R^6$ each independently represents a monovalent hydrocarbon group which is optionally substituted; and $R^7$, $R^8$ and $R^9$ each independently represents an alkyl group having 1 to 6 carbons, wherein the composition comprises 10 ppm or less halogen impurity and 100 ppb or less metallic impurity wherein boron is counted in the metallic impurity.

2. The composition for forming a porous film according to claim 1 wherein the total carbon number of $R^7$, $R^8$ and $R^9$ in said trialkylmethylammonium hydroxide is 4 to 15.

3. The composition for forming a porous film according to claim 1, wherein said hydrolysis and condensation product of an alkoxysilane or the partial hydrolysis product of the alkoxysilane comprises a product having a weight-average molecular weight of 10,000 to 1,000,000.

4. A method for manufacturing a porous film comprising applying a composition according to claim 1 to a substrate to form a film thereon, drying the film and heating the dried film to produce a porous film.

5. A porous film comprising a composition according to claim 1.

6. An interlevel insulating film comprising a composition according to claim 1.

7. A semiconductor device comprising a porous film therein, the porous film formed of a composition comprising 10 ppm or less halogen impurity and 100 ppb or less metallic impurity where boron is counted in the metallic impurity, the composition comprising the hydrolysis and condensation product of an alkoxysilane or a partial hydrolysis product of the alkoxysilane in an organic solvent in the presence of trialkylmethylammonium hydroxide as a catalyst, wherein the trialkylmethylammonium hydroxide comprises a reaction product of trialkylamine and dimethyl carbonate, and wherein the alkoxysilane comprises one or more alkoxysilanes selected from the group consisting of compounds represented by formulae (1) to (4) below, and the trialkylmethylammonium hydroxide is represented by formula (5)

(1)
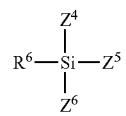

(2)
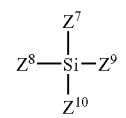

(3)
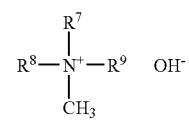

(4)
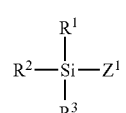

(5)

$$R^8\!-\!\underset{\underset{CH_3}{|}}{\overset{\overset{R^7}{|}}{N^+}}\!-\!R^9 \quad OH^-$$

below, wherein $Z^1$, $Z^2$, $Z^3$, $Z^4$, $Z^5$, $Z^6$, $Z^7$, $Z^8$, $Z^9$ and $Z^{10}$ each independently represents an alkoxy group having 1 to 6 carbons; $R^1$, $R^2$, $R^3$, $R^4$, $R^5$ and $R^6$ each independently represents a monovalent hydrocarbon group which is optionally substituted; and $R^7$, $R^8$ and $R^9$ each independently represents an alkyl group having 1 to 6 carbons.

8. The semiconductor device according to claim 7 wherein the total carbon number of $R^7$, $R^8$ and $R^9$ in said trialkylmethylammonium hydroxide is 4 to 15.

9. The semiconductor device according to claim 7 wherein said hydrolysis and condensation product of an alkoxysilane or the partial hydrolysis product of the alkoxysilane comprises a product having a weight-average molecular weight of 10,000 to 1,000,000.

10. The semiconductor device according to claim 7 wherein said porous film is between metal interconnections in a same layer or multi-level interconnects, or is between upper and lower metal interconnection layers.

11. A method for manufacturing a composition for forming a porous film, comprising hydrolysing and condensing an alkoxysilane or a partial hydrolysis product of the alkoxysilane in an organic solvent in the presence of trialkylmethylammonium hydroxide as a catalyst, wherein the alkoxysilane comprises one or more alkoxysilanes selected from the group consisting of compounds represented by formulae (1) to (4) below, and the trialkylmethylammonium hydroxide is represented by formula (5) below which is a reaction product of trialkylamine and dimethyl carbonate, (1)
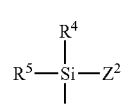

(2)

(3)
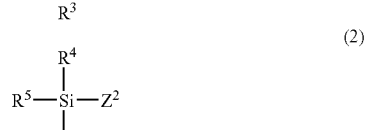

(3)
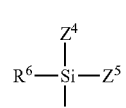

-continued
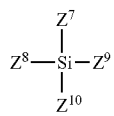
(4)
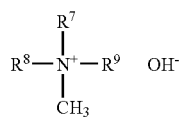
(5)
wherein $Z^1$, $Z^2$, $Z^3$, $Z^4$, $Z^5$, $Z^6$, $Z^7$, $Z^8$, $Z^9$ and $Z^{10}$ each independently represents an alkoxy group having 1 to 6 carbons; $R^1$, $R^2$, $R^3$, $R^4$, $R^5$ and $R^6$ each independently represents a monovalent hydrocarbon group which is optionally substituted; and $R^7$, $R^8$ and $R^9$ each independently represents an alkyl group having 1 to 6 carbons.
* * * * *